(12) United States Patent
Kokabi et al.

(10) Patent No.: US 11,353,427 B2
(45) Date of Patent: Jun. 7, 2022

(54) ELECTROMAGNETIC SENSING DEVICE FOR DETECTING MAGNETIC NANOPARTICLES

(71) Applicants: Université Pierre et Marie Curie, Paris (FR); Centre National de la Recherche Scientifique, Paris (FR); Forschungszentrum Jülich GmbH, Jülich (DE)

(72) Inventors: Hamid Kokabi, Villeneuve la Garenne (FR); Hans-Joachim Krause, Baesweiler (DE); Kieu An Ngo, Moissy-Cramayel (FR); Amine Rabehi, Vanves (FR)

(73) Assignees: SORBONNE UNIVERSITE, Paris (FR); Centre National de la Recherche Scientifique, Paris (FR); Forschungszentrum Jülich GmbH, Jülich (DE)

( * ) Notice: Subject to any disclaimer, the term of this patent is extended or adjusted under 35 U.S.C. 154(b) by 181 days.

(21) Appl. No.: 16/754,815

(22) PCT Filed: Oct. 5, 2018

(86) PCT No.: PCT/EP2018/077183
§ 371 (c)(1),
(2) Date: Apr. 9, 2020

(87) PCT Pub. No.: WO2019/072720
PCT Pub. Date: Apr. 18, 2019

(65) Prior Publication Data
US 2021/0190726 A1  Jun. 24, 2021

(30) Foreign Application Priority Data
Oct. 12, 2017  (EP) .................................... 17306381

(51) Int. Cl.
*G01N 27/74* (2006.01)
*G01R 33/12* (2006.01)

(52) U.S. Cl.
CPC ....... *G01N 27/745* (2013.01); *G01R 33/1269* (2013.01)

(58) Field of Classification Search
CPC .......................... G01R 33/1269; G01N 27/745
(Continued)

(56) References Cited

U.S. PATENT DOCUMENTS 9,063,092 B2 * 6/2015 Kahlman ........... G01N 21/8483
9,567,626 B2 * 2/2017 Cardoso ............... C12Q 1/6825
(Continued)

OTHER PUBLICATIONS

Peterson, K. A., et al. "LTCC in microelectronics, microsystems, and sensors." 2008 15th International Conference on Mixed Design of Integrated Circuits and Systems. IEEE, 2008. (Year: 2008).*
(Continued)

*Primary Examiner* — Christopher P McAndrew
(74) *Attorney, Agent, or Firm* — Osha Bergman Watanabe & Burton LLP

(57) ABSTRACT

An electromagnetic sensing device comprising: a reference microfluidic reservoir to receive a reference substance with magnetic nanoparticles; an analyte microfluidic reservoir to receive an analyte and magnetic nanoparticles; a first excitation magnetic coil to subject the reference microfluidic reservoir to an alternating magnetic field at a first frequency; a second excitation magnetic coil to subject the analyte microfluidic reservoir to an alternating magnetic field at the first frequency; a third excitation magnetic coil to subject the reference microfluidic reservoir to an alternating magnetic field at a second frequency distinct from the first frequency; a fourth excitation magnetic coil to subject the analyte microfluidic reservoir to an alternating magnetic field at the second frequency; a first detection magnetic coil to detect a
(Continued)

response magnetic field of the magnetic nanoparticles in the reference microfluidic reservoir; a second detection magnetic coil to detect a response magnetic field of the magnetic nanoparticles.

15 Claims, 12 Drawing Sheets

(58) Field of Classification Search
USPC ........................................................ 324/228
See application file for complete search history.

(56) References Cited

U.S. PATENT DOCUMENTS

| 9,841,421 B2* | 12/2017 | Dittmer ................ G01N 21/552 |
| 2007/0155024 A1 | 7/2007 | Miethe et al. |
| 2008/0218165 A1 | 9/2008 | Kahlman et al. |

OTHER PUBLICATIONS

Pamme, Nicole. "Magnetism and microfluidics." Lab on a Chip 6.1 (2006): 24-38. (Year: 2006).*

International Search Report issued in Application No. PCT/EP2018/077183, dated Jan. 8, 2019 (5 pages).

Written Opinion issued in International Application No. PCT/EP2018/077183, dated Jan. 8, 2019 (11 pages).

Krause et al.; "Magnetic particle detection by frequency mixing for immunoassay applications;" Journal of Magnetism and Magnetic Materials 311; 2007; pp. 436-444 (9 pages).

Rabehi et al.; "Electromagnetic Immunoassays using Magnetic Nanoparticles in a Microfluidic Structure;" Journée d'Etude sur la TéléSANté, 6éme edition; May 2017; Bourges, France (3 pages).

Rabehi et al.; "Magnetic Detection Structure for LOC Immunoassays, Multiphysics Simulations and Experimental Results;" Proceedings; Aug. 18, 2017; (5 pages).

Hong et al.; "Magnetic particle imaging with a planar frequency mixing magnetic detection scanner;" Review of Scientific Instruments; Jan. 21, 2014; (5 pages).

* cited by examiner

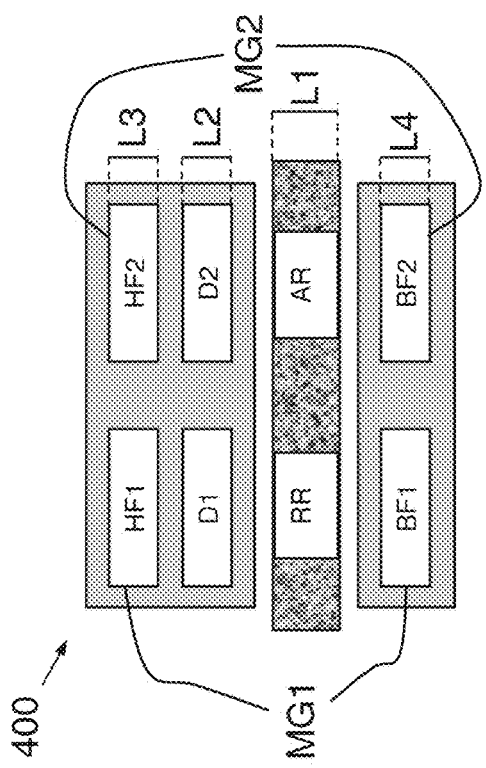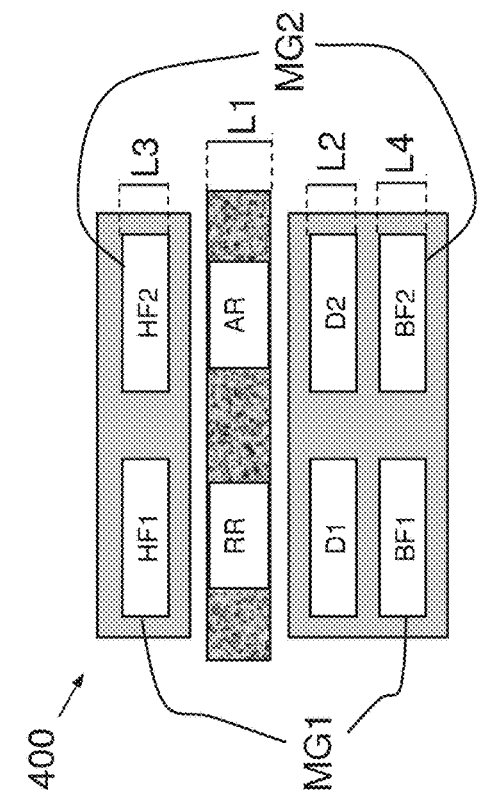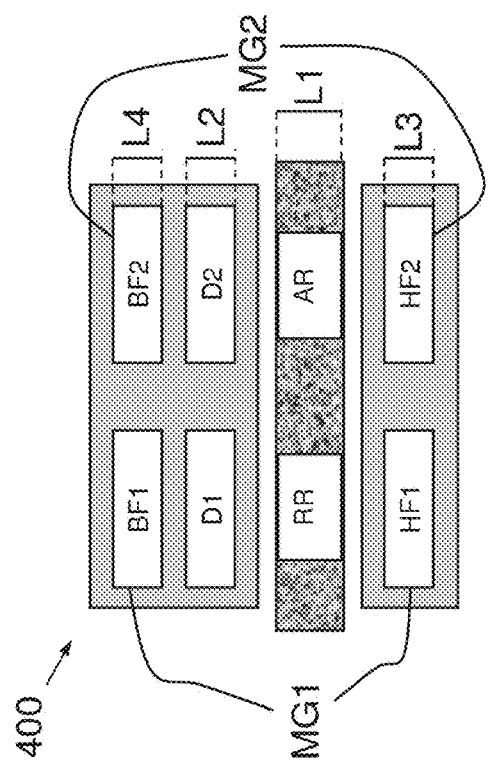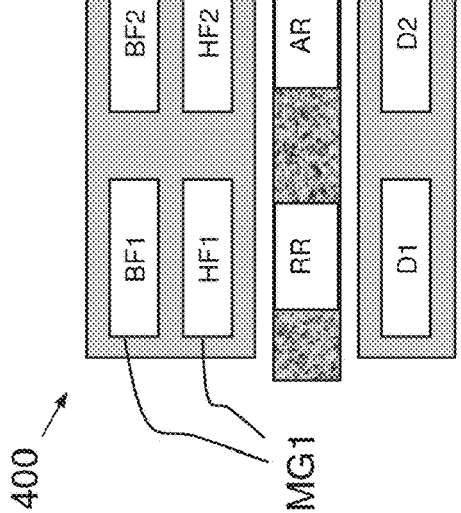

FIG.6(b) Reference and analyte microfluidic reservoirs
FIG.6(c) Detection structure
FIG.6(d) Design and realization of a 3D printed mold for microfluidic reservoirs (PDMS)
FIG.6(e) Design and realization of a multilayer printed circuit board (8 layers PCB) for excitation and detection coils

ELECTROMAGNETIC SENSING DEVICE FOR DETECTING MAGNETIC NANOPARTICLES

TECHNICAL FIELD

The present disclosure relates to a method and magnetic sensing system for detecting magnetic nanoparticles, for example magnetic nanoparticles in analytes.

BACKGROUND

Thanks to the capacity of magnetic nanoparticles to bind between antigens and antibodies, the magnetic nanoparticles may be used as magnetic markers to quantify the biological entities with which the magnetic nanoparticles are bound. The magnetic nanoparticles linked to biological entities (e.g. pathogens, viruses, bacteria, proteins, cells . . . ) may for example be used for diagnosis purposes in the implementation of immunoassays, but also in the fields of environmental science and food quality control in which antibodies produced by biotechnology that are used and may thus be detected by means of magnetic nanoparticles.

FIG. 1 illustrates schematically the antibody-antigen interaction. Each magnetic nanoparticle 104 (hereafter MNP) covered on its surface with a biocompatible layer 105 (e.g. a streptavidin shell) may be specifically bound with analyte, cells, viruses, pathogens, proteins, or bacteria. A surface 100 of a reservoir is coated with a primary antibody 101 and the bounding with the MNP 104 occurs through the antigen 102 and biotin 103 with the biocompatible layer 105.

Among the available magnetic sensing techniques using MNP having antibody-antigen affinity, a technique based on a frequency mixing method has the advantage to detect and quantify MNP with a very wide dynamic range. Patent application US 2007/0155024 A1 discloses an example method and device using this frequency mixing principle. The method is used for detecting MNP having non-linear magnetization characteristics, e.g. superparamagnetic and/or ferromagnetic nanoparticles.

FIG. 2 illustrates the magnetization characteristic of superparamagnetic nanoparticles. The magnetization M of MNP subjected to a uniform magnetic field is defined by equation 201 as a Langevin function of the magnetic susceptibility, where H is the magnetic field, $\mu_0$ is the magnetic permeability of free space, $m_0$ is magnetic moment, $k_B$ is the Boltzmann constant, and T is the absolute temperature. The magnetization M is a non-linear function, represented by the curve 202, of the magnetic field H.

The nonlinear magnetization characteristic of superparamagnetic and ferromagnetic substances may be exploited for the selective detection of these substances. The method utilizes the dependency of the differential susceptibility (that is the derivative of the magnetic susceptibility) upon the magnetic field acting on the particles.

In the frequency mixing method, the MNP are subjected to a first alternating magnetic field (hereafter, the modulating magnetic field or low frequency magnetic field). The modulating magnetic field may have a frequency $f_2$ between 1 and 500 Hz, preferably between 50 and 100 Hz. The frequency should be selected low enough so that the particles' magnetization is able to follow the field and can be driven close to saturation. This condition limits the upper frequency limit. The frequency should be high enough so that it can be demodulated, therefore it should be higher than two times the measurement time. By selecting such low frequency alternating magnetic fields, low currents and voltages may be used for producing the modulating magnetic field by means of an inductive coil with many windings because the impedance of the inductive coil is not limited by the inductance of the inductive coil.

Simultaneously, the MNP are subjected to a second alternating magnetic field (hereafter, the scanning magnetic field or high frequency magnetic field) with a different frequency from that of the modulating magnetic field. The scanning magnetic field may have a frequency $f_1$ between 2 and 1000 kHz, preferably between 10 and 100 kHz. The lower limit of its frequency should be chosen at least four times the frequency of the modulating magnetic field in order to assure separability of the mixing frequencies from the harmonics of both excitation fields. The upper limit should be chosen such that it is not much higher than the characteristic upper limit frequency of the MNP over which the particles cannot follow the magnetic field any more. The second alternating field serves for scanning the nonlinearity of the magnetization characteristic of the MNP.

As a result of the effects of the two alternating magnetic fields, there is an induced response magnetic field of the MNP which can be measured and analyzed. For the purpose of the measurement, a magnetic coil may be used as a magnetic field sensor, and a voltage is generated by the induced response magnetic field in this coil, this voltage being proportional to the frequency of the response magnetic field. This voltage is relatively high and may thus be easily measured and analyzed.

The induced response magnetic field is also an alternating magnetic field whose amplitude variation is primarily dependent upon the type or concentration of the MNP.

FIGS. 3(a)-3(e) illustrate the principles of the frequency mixing method. FIG. 3(a) represents the non-linear relationships between the magnetization M and the magnetic field H as already explained by reference to FIG. 2. FIG. 3(b) represents the temporal variations of the total excitation magnetic field resulting from the mixing of a modulating magnetic field at frequency $f_2$ and a scanning magnetic field at frequency $f_1$: the total magnetic field resulting is a modulated magnetic field. FIG. 3(d) shows the frequency spectrum of total excitation magnetic field: two main energy peaks are present at frequencies $f_1$ and $f_2$.

FIG. 3(c) represents the temporal variations of the induced response magnetic field. As can be seen by comparing FIGS. 3(b) and 3(c), due to the non-linear magnetization characteristic, the shape of the induced response magnetic field is modified compared to the shape of the total magnetic field. FIG. 3(e) show the frequency spectrum of the response magnetic field: several additional energy peaks are present compared to the frequency spectrum of total excitation magnetic field of FIG. 3(b). Due to the non-linear magnetization characteristics of the MNP, the induced response magnetic field comprises additional frequency components, i.e. frequency mixing components: first frequency components which are a multiple (e.g. $3f_2$, $5f_2$, . . . ) of the frequency $f_2$ of the modulating magnetic field and second frequency components around the frequency $f_1$ of the scanning magnetic field (e.g. $f_1+2*f_2$, $f_1-2*f_2$, . . . ).

The presence of the MNP in the analytes may be detected simply by detecting the presence of frequency mixing components in the induced response magnetic field. Further, by studying the characteristics (e.g. amplitude and phase) of higher order frequency mixing components, the nonlinear "signatures" of different types of MNP may be discriminated. The method is thus efficient for detecting various types of MNP.

Several attempts have been made to implement magnetic sensing system using MNP and the frequency mixing principle. In the Patent application US 2007/0155024 A1, the sensing system is rather voluminous and comprises three series of cylindrical coils used for the low and high frequency magnetic excitations coils and the detection coils. The sample holder is a cylindrical test tube.

There is a need for a portable magnetic sensing system that would be sensitive with a low limit of detection (LOD), cost effective, selective, simple and with a large dynamic range. However, by reducing the dimensions of the sensing system, the total possible amount of analyte is reduced, which may be seen per se as an advantage, but the sensitivity of the sensing system is also reduced. Having a low cost and very sensitive detection system is in fact rather challenging.

SUMMARY

According to a first aspect, the present description relates to an electromagnetic sensing device for detecting magnetic nanoparticles, MNP. The electromagnetic sensing device comprises: a reference microfluidic reservoir configured to receive a reference substance with MNP; an analyte microfluidic reservoir configured to receive an analyte and MNP; an input channel for introducing the analyte into the analyte microfluidic reservoir; at least one first excitation magnetic coil configured to subject the reference microfluidic reservoir to an alternating magnetic field at a first frequency; at least one second excitation magnetic coil configured to subject the analyte microfluidic reservoir to an alternating magnetic field at the first frequency; at least one third excitation magnetic coil configured to subject the reference microfluidic reservoir to an alternating magnetic field at a second frequency distinct from the first frequency; at least one fourth excitation magnetic coil configured to subject the analyte microfluidic reservoir to an alternating magnetic field at the second frequency; at least one first detection magnetic coil configured to detect a response magnetic field of the MNP in the reference microfluidic reservoir; at least one second detection magnetic coil configured to detect a response magnetic field of the MNP in the analyte microfluidic reservoir. The electromagnetic sensing device is structured according to a plurality of superimposed layers, comprising at least three coil layers and a reservoir layer. Each of the reference microfluidic reservoir is integrated into a first plate in the reservoir layer and the analyte microfluidic reservoir is integrated into a second plate in the reservoir layer. The first and second detection magnetic coils are integrated into a first printed-circuit-board, PCB, substrate in a first coil layer. The first and second excitation magnetic coils are integrated into the PCB substrate in a second coil layer. The third and fourth excitation magnetic coils are integrated into the PCB substrate in a third coil layer. The reservoir layer is immediately between the first coil layer and one of the second and third coil layers.

The sensing device according to the first aspect has a symmetric layered structure that makes is easy to use and produce. This multilayer PCB based sensing device is also a low cost device suitable for being industrially produced and used at a low cost, for example using a cleanroom technology.

This sensing device is fully portable and may be manufactured with small dimensions (e.g. the usable two multilayer PCBs above and under the microfluid reservoirs plates as shown in FIGS. 4(g) or 4(h), may have a width between 20 and 40 mma length between 50 and 100 mm, and a thickness between 4 and 7 mm) and a small weight (e.g. between 10 and 70 grams).

Due to the symmetrical structure between the reference part comprising the reference microfluidic reservoir and the analyte part comprising the analyte microfluidic reservoir, gradiometric and reference measurements can be obtained, simultaneously and under the same conditions (temperature, etc), for the reference substance and the analyte, thus improving the accuracy of the measure.

As only a small amount of the analyte is necessary (around 10-15 µl), the sensing device may be used for analyzing a quantity of analyte corresponding to the volume of a drop of blood: this facilitates and simplifies the taking of the analyte on a human/animal. The measurement time is also reduced.

Further, the electromagnetic sensing device has a relatively high detection sensitivity and has proven to provide a linear output. A limit of detection (LOD) of 15 µg/mL of 20 nm core sized nanoparticles may be obtained with a good linearity over 3 orders of magnitude. This result has been obtained with the first prototype of the magnetic detection microfluidic device with the dimensions of 40×100×7 mm$^3$ The current LOD for unbound MNP detection can be between 15 and g/ml. Further the dimensions, noise reduction features and relative positions of the magnetic coils and reservoirs may be adjusted to optimize and highly reduce the LOD for unbound MNP.

The limit of detection (LOD) comes from the gradiometric measurement between the reference microfluidic reservoir and the analyte microfluidic reservoir, the small distance between the detection coils and the microfluidic reservoirs and finally from the detection method of mixing frequencies. Other advantage can be the time of analysis which will be just a few minutes.

In one or more embodiments of the electromagnetic sensing device according to the first aspect, the first, and correspondingly the second plate, is an electrically insulating plate, made of polydimethylsiloxane on glass in which the reference microfluidic reservoir, and correspondingly the analyte microfluidic reservoir, is formed.

In one or more embodiments of the electromagnetic sensing device according to the first aspect, the first and second plates are two physically distinct plates.

In one or more embodiments of the electromagnetic sensing device according to the first aspect, the first and second plates are one and the same plate.

In one or more embodiments of the electromagnetic sensing device according to the first aspect, the analyte microfluidic reservoir has the shape of a serpentine channel.

In one or more embodiments of the electromagnetic sensing device according to the first aspect, the third coil layer is the uppermost or lowest layer among the plurality of superimposed layers.

In one or more embodiments, the electromagnetic sensing device according to the first aspect comprises a fourth coil layer with additional excitation coils for subjecting both the reference microfluidic reservoir and the analyte microfluidic reservoir to an alternating magnetic field at the first or second frequency.

In one or more embodiments of the electromagnetic sensing device according to the first aspect, two successive coil layers are formed on the upper face and lower face of a same PCB.

In one or more embodiments of the electromagnetic sensing device according to the first aspect, the excitation magnetic coils and/or detection magnetic coils comprises miniaturized planar coils.

In one or more embodiments of the electromagnetic sensing device according to the first aspect, the excitation magnetic coils and/or detection magnetic coils comprises spiral coils.

In one or more embodiments of the electromagnetic sensing device according to the first aspect, each of the excitation magnetic coils and/or detection magnetic coils is a three-dimensional coil made of stacked spiral planar coils.

In one or more embodiments, the electromagnetic sensing device according to the first aspect comprises two analyte microfluidic reservoirs, and correspondingly two reference microfluidic reservoirs, wherein each analyte microfluidic reservoir, and correspondingly each reference microfluidic reservoir, is filled with a single type of MNP, distinct from the type of MNP filled in the other reference microfluidic reservoir, and correspondingly the other analyte microfluidic reservoir.

The embodiments of the electromagnetic sensing device according to the first aspect may be combined in various ways.

According to a second aspect, the present description relates to electromagnetic sensing system. The electromagnetic sensing system comprises: an electromagnetic sensing device according to the first aspect; a first oscillator configured to generate an electrical signal at the first frequency and to feed the first and second excitation magnetic coils; a second oscillator configured to generate an electrical signal at the second frequency and to feed the third and fourth excitation magnetic coils; a first lock-in amplifier configured to receive the electrical signals generated by the detection magnetic coils and the electrical signal at the first frequency; a second lock-in amplifier configured to receive a signal generated by the first lock-in amplifier and the electrical signal at the second frequency; a data processing device configured to generate a frequency spectrum of a signal produced by the second lock-in amplifier and to analyze the frequency spectrum.

According to a third aspect, the present description relates to a method for detecting MNP using an electromagnetic sensing device according to the first aspect. The method comprises: subjecting the reference microfluidic reservoir and the analyte microfluidic reservoir to two alternating magnetic fields having distinct frequencies; detecting simultaneously a first response magnetic field of the MNP in the reference microfluidic reservoir and; a second response magnetic field of the MNP in the analyte microfluidic reservoir.

In one or more embodiments, the method according to the third aspect comprises: comparing the first response magnetic field and the second response magnetic field to detect or quantify biological entities in the analyte microfluidic reservoir.

The embodiments of the method according to the third aspect may comprise any step that is described therein for an electromagnetic sensing device or an electromagnetic sensing system according to the present description.

BRIEF DESCRIPTION OF THE DRAWINGS

Other advantages and characteristics of the disclosed devices and methods will become apparent from reading the description, illustrated by the following figures, where:

FIG. 4(a)-4(h) represent schematically example embodiments of an electromagnetic sensing device based on two multilayer PCBs above and under the microfluidic reservoirs plates;

FIGS. 6(a)-6(e) represent schematically a method for manufacturing an electromagnetic sensing device combined of two multilayer PCBs above and under the microfluidic reservoirs plates;

In the FIGS., identical elements are indicated by the same references.

DETAILED DESCRIPTION

Several embodiments of an electromagnetic sensing method, device and system for detecting MNP will be described in detail by reference to the figures.

In one or more embodiments, the present description concerns an electromagnetic sensing device and system for detecting MNP in an analyte. The MNP may be configured to bind to secondary antibodies in an immunometric configuration (sandwich immunoassay). They may be used as magnetic markers to quantify the biological entities.

In an electromagnetic sensing device, different sizes and types of MNP may be used or only a given type and size of MNP. In one or more embodiments, MNP having a non-linear magnetization characteristic are used, for example superparamagnetic nanoparticles (SPN) or ferromagnetic nanoparticles.

Example embodiments (side view) of the electromagnetic sensing device 400 are schematically represented by FIG. 4. The electromagnetic sensing device 400 allows for example the detection and the quantification of MNP used as markers in immunoassays.

Figure 1:
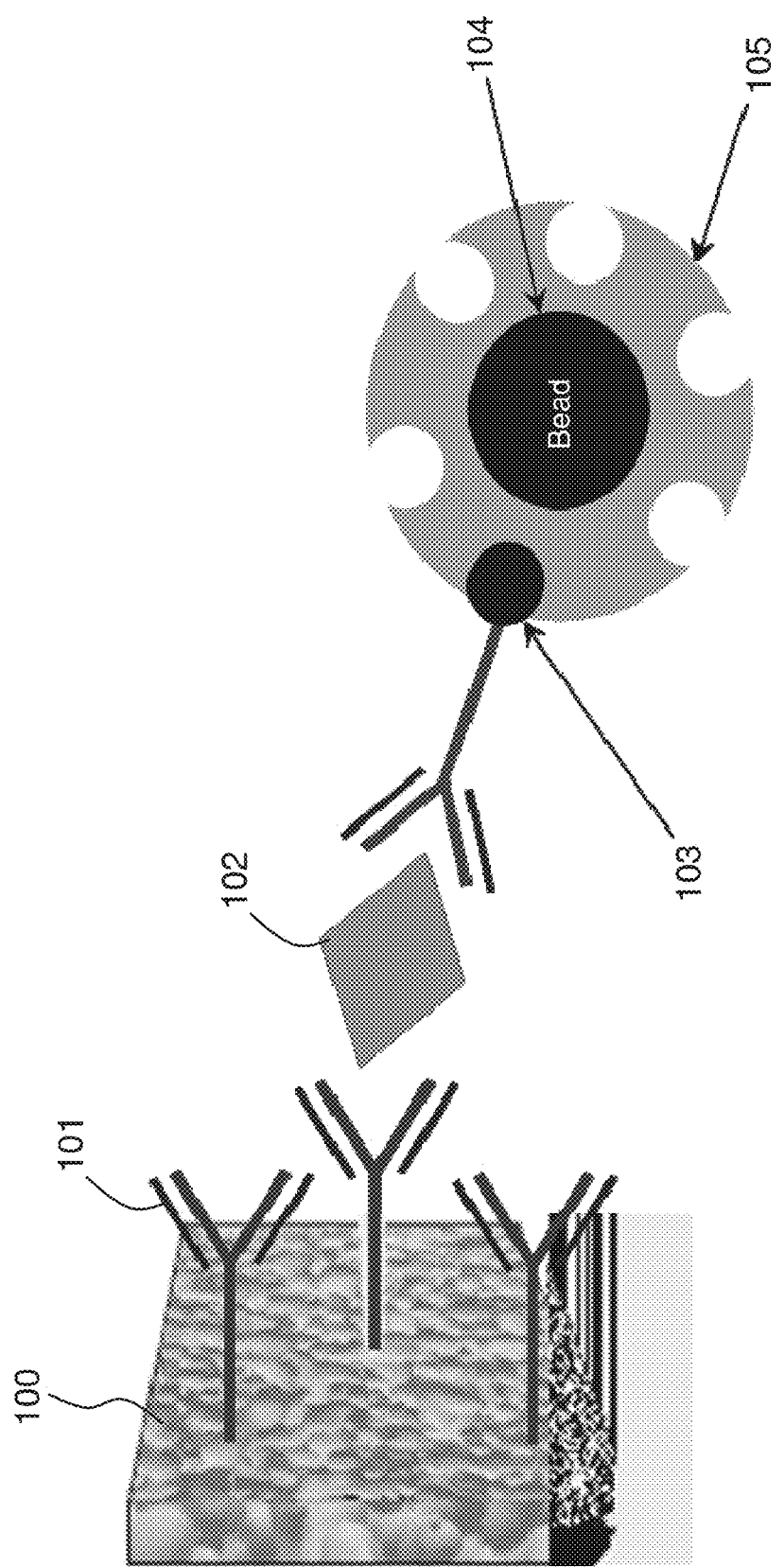
FIG. 1, already described, illustrates schematically the antibody-antigen interaction.
Figure 2:
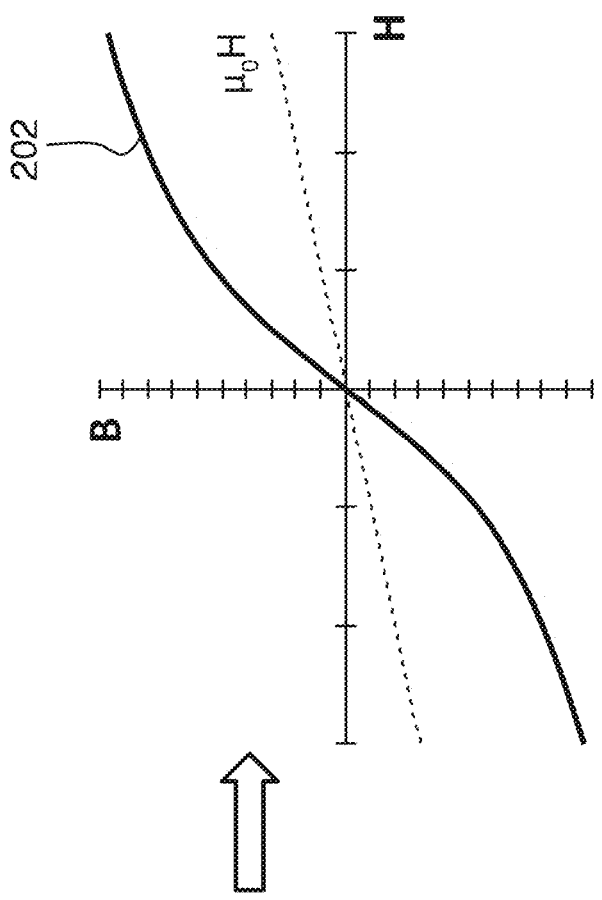
FIG. 2, already described, illustrates the magnetization characteristic of superparamagnetic nanoparticles.
Figure 3:
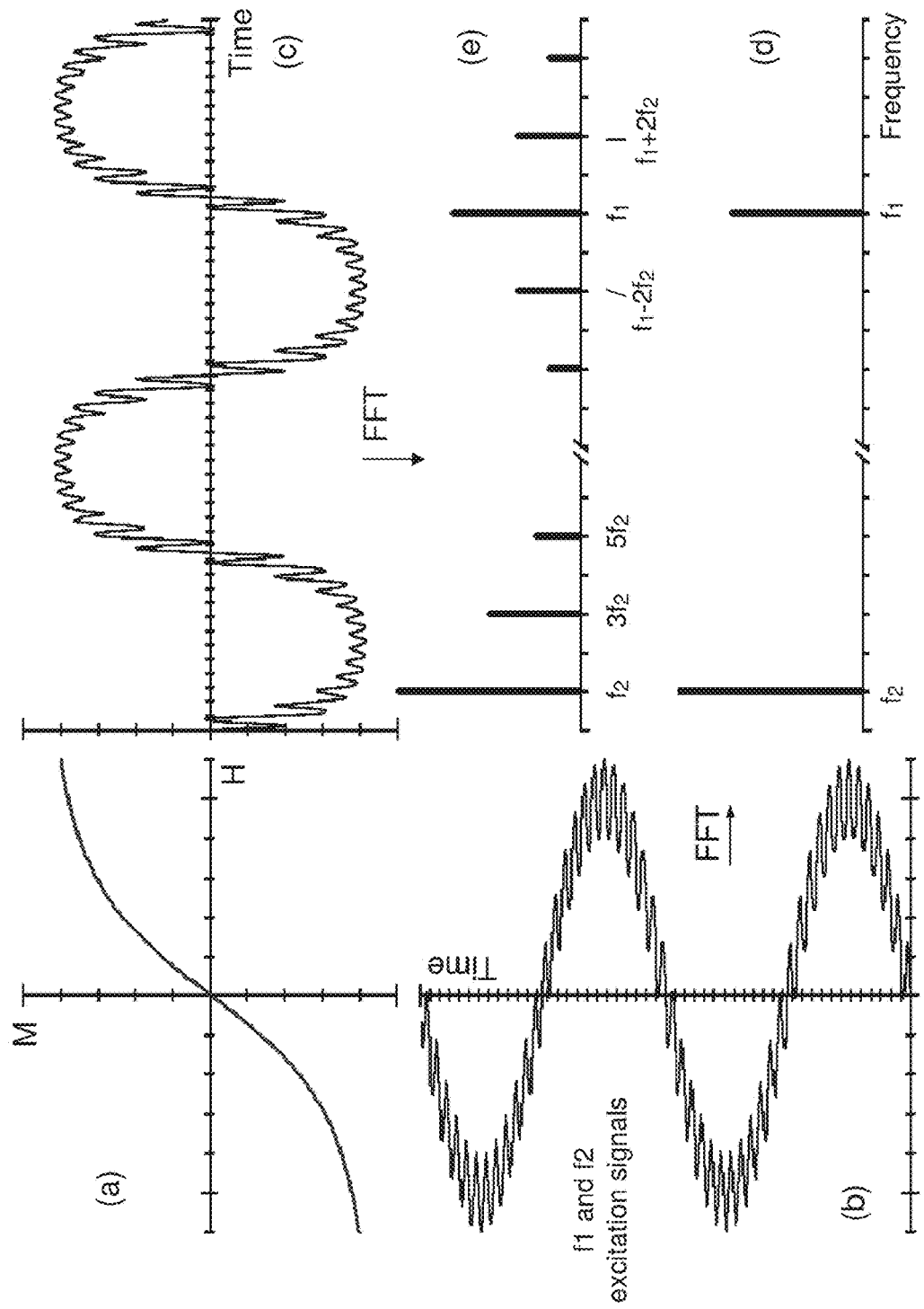
FIGS. 3(a)-3(e), already described, illustrate the principles of the frequency mixing method.

In one or more embodiments, the electromagnetic sensing device 400 comprises a reference microfluidic reservoir RR for receiving a reference substance with MNP and an analyte microfluidic reservoir AR for receiving an analyte (i.e. a sample to be analyzed) bounded to MNP. The analyte may be any biological substance to be analyzed that comprises elements on which MNP may be bound. The inner surface of the reference microfluidic reservoir RR and the analyte microfluidic reservoir AR are coated with primary antibodies, as explained by reference to FIG. 1, before introducing the MNP and the reference substance or analyte into the corresponding microfluidic reservoir.

The analyte can be formed by a method known per se, for example a physisorption reaction, a chemisorption reaction, precipitation, filtration or extraction and is then introduced into a microfluidic reservoir. Detectable superparamagnetic and/or ferromagnetic nanoparticles are coupled to the analyte before the measurements can be performed.

The analyte is introduced through an input channel into the analyte microfluidic reservoir AR, and after a given reaction time, the measurement of the response magnetic fields may be performed. Non-bound MNP will flow outside the analyte microfluidic reservoir AR through an output channel. The flow is stopped before the measurements, i.e. the excitation magnetic fields are interrupted. Alternatively the measurement can be performed with ongoing flow.

In one or more embodiments, the electromagnetic sensing device 400 comprises a magnetic field generator for subjecting both the reference microfluidic reservoir RR and the analyte microfluidic reservoir AR to two alternating magnetic fields having distinct frequencies, e.g. a high frequency magnetic field preferably in the 10-100 kilohertz range and a low frequency magnetic field preferably in the 50-100 Hertz range. The reference microfluidic reservoir RR and the analyte microfluidic reservoir AR are subjected to the same two alternating magnetic fields.

In one or more embodiments, a first magnetic field generator MG1 is used for subjecting the reference microfluidic reservoir RR to the two alternating magnetic fields and a second magnetic field generator MG2, distinct from the first magnetic field generator MG1 but identically implemented, is used for subjecting the reference microfluidic reservoir RR to the same two alternating magnetic fields.

In one or more embodiments, the first magnetic field generator MG1 comprises one or more excitation magnetic coils HF1 for producing the high frequency magnetic field and one or more excitation magnetic coils BF1 for producing the low frequency magnetic field. Similarly, the second magnetic field generator MG2 also comprises one or more excitation magnetic coils HF2 for producing the high frequency magnetic field and one or more excitation magnetic coils BF1 for producing the low frequency magnetic field.

In one or more embodiments, the first magnetic field generator MG1 comprises one or more excitation magnetic coils HF1 for producing the high frequency magnetic field and one or more permanent magnets BF1 for producing the low frequency magnetic field. Similarly, the second magnetic field generator MG2 also comprises one or more excitation magnetic coils for producing the high frequency magnetic field HF2 and one or more permanent magnets BF2 for producing the low frequency magnetic field.

In one or more embodiments, the electromagnetic sensing device 400 comprises one or more first detection magnetic coils D1 for detecting a response magnetic field of the MNP in the reference microfluidic reservoir RR and one or more second detection magnetic coils D2 for detecting a response magnetic field of the bound MNP in the analyte microfluidic reservoir AR.

In one or more embodiments, the electromagnetic sensing device 400 is structured according to a plurality of superimposed layers, hereafter noted L1, L2, L3, L4, L5, comprising at least three coil layers (L2, L3, L4, L5) and a reservoir layer L1.

In one or more embodiments, the electromagnetic sensing device 400 comprises the reference analyte microfluidic reservoir RR which is integrated into a first plate (hereafter, the first reservoir plate) in a first layer, i.e. the reservoir layer L1, and the analyte microfluidic reservoir AR which is integrated into a second plate (the second reservoir plate) in the first layer L1. The first and second reservoir plates are electrically insulating plates. For example the first and second reservoir plates are made of polydimethylsiloxane (PDMS)/glass, in which the reservoirs AR and RR are formed.

In one or more embodiments, the first and second reservoir plates are two physically separated plates: the first plate integrating the analyte microfluidic reservoir AR for the analyte may thus be easily removed and/or replaced as necessary, for example after each measurement. In one or more embodiments, the first and second reservoir plates are manufactured as one in the same piece.

Figure 6A:
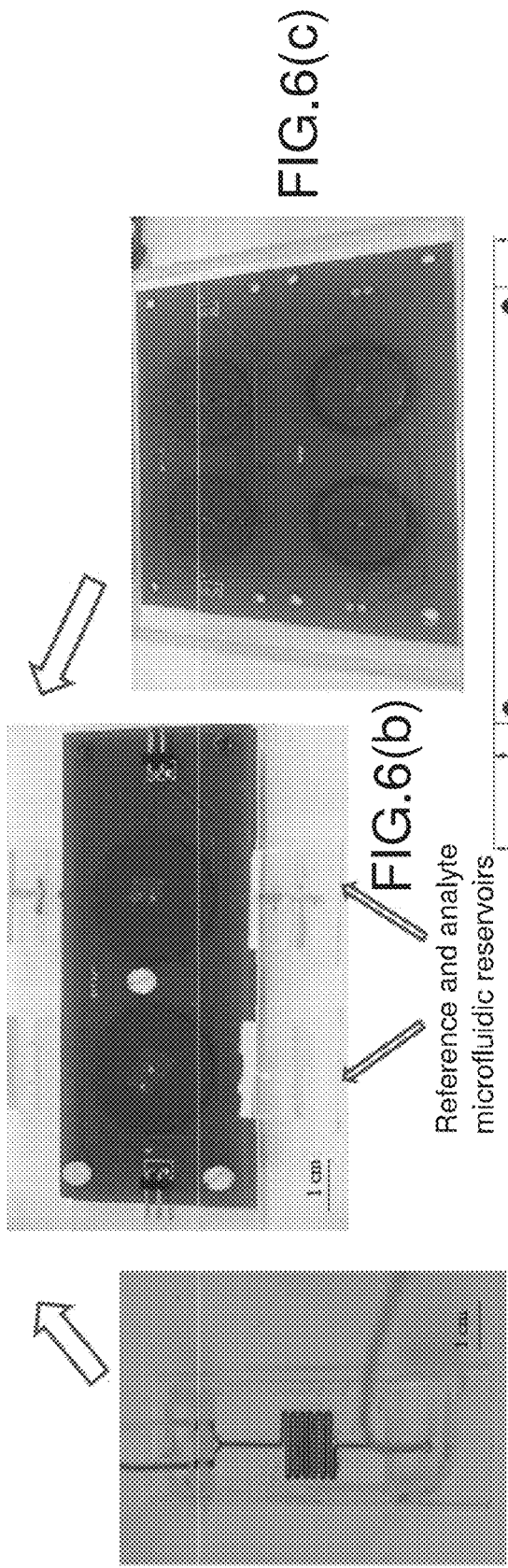

In one or more embodiments, the reservoirs AR and RR are planar reservoirs. The reservoirs AR and RR may have different shapes: circular, elliptical, rhombical, diamond-shaped or other. The shape of the microfluidic reservoir and channels may be chosen to facilitate the filling and improve the fluid flow velocity in the reservoir and input/output channels. In one or more embodiments, the analyte microfluidic reservoir AR is a planar serpentine channel as illustrated by FIG. 6(a). The analyte is introduced through an input channel CHi into the analyte microfluidic reservoir AR. A serpentine reservoir may be produced by using a 3D printed mold as represented by FIG. 6(b). A serpentine reservoir enables to better control the flow of the analyte in the analyte microfluidic reservoir and to ensure that non-bound MNP will be efficiently directed by the flow towards the output channel CHo at the output of the serpentine reservoir.

In one or more embodiments, the electromagnetic sensing device 400 is implemented as a Printed-Circuit-Board (PCB) device comprising a plurality of coil layers L2 to L5, each coil layer being integrated into a PCB substrate. Each coil layer may be made as a thin film on a multilayer PCB substrate.

In one or more embodiments, the detection magnetic coils D1 and D2 are integrated into a first PCB substrate in a second layer L2 that is a coil layer. In one or more embodiments, the excitation coils HF1, HF2 for the high frequency magnetic field are integrated into a second PCB substrate in a third layer L3 that is a coil layer. In one or more embodiments, the excitation coils (or the permanent magnets) BF1, BF2 for the low frequency magnetic field are integrated into a third PCB substrate in a fourth layer L4 that is a coil layer.

In one or more embodiments, the layer L4 is an upper or lower layer among the plurality of layers. In one or more embodiments, the first layer L1 is between the second layer L2 and one of the third layer L3 and the fourth layer L4. The electromagnetic sensing device 400 is thus structured as a "sandwich", in which the reservoir layer comprising the microfluidic reservoirs is immediately (e.g. without intermediate coil layer) between the coil layer comprising the detection magnetic coils and one of the coil layers comprising magnetic excitation coils.

In the embodiment of FIG. 4(a), the upper layer is the layer L4 with the low frequency excitation coils BF1 and BF2, then comes the layer L2 with the detection magnetic coils D1 and D2, the layer L1 with the two microfluidic reservoirs RR and AR, and finally the layer L3 with the high frequency excitation coils HF1 and HF2.

In the embodiment of FIG. 4(b), the upper layer is the layer L3 with the high frequency excitation coils HF1 and HF2, then comes the layer L2 with the detection magnetic coils D1 and D2, the layer L1 with the two microfluidic reservoirs RR and AR, and finally the layer L4 with the low frequency excitation coils BF1 and BF2.

In the embodiment of FIG. 4(c), the upper layer is the layer L4 with the low frequency excitation coils BF1 and BF2, then comes the layer L3 with the high frequency excitation coils HF1 and HF2, the layer L1 with the two microfluidic reservoirs RR and AR, and finally the layer L2 with the detection magnetic coils D1 and D2.

In the embodiment of FIG. 4(d), the upper layer is the layer L3 with the high frequency excitation coils HF1 and HF2, then comes the layer L1 with the two microfluidic reservoirs RR and AR, the layer L2 with the detection magnetic coils D1 and D2, and finally the layer L4 with the low frequency excitation coils BF1 and BF2.

Figure 4F:
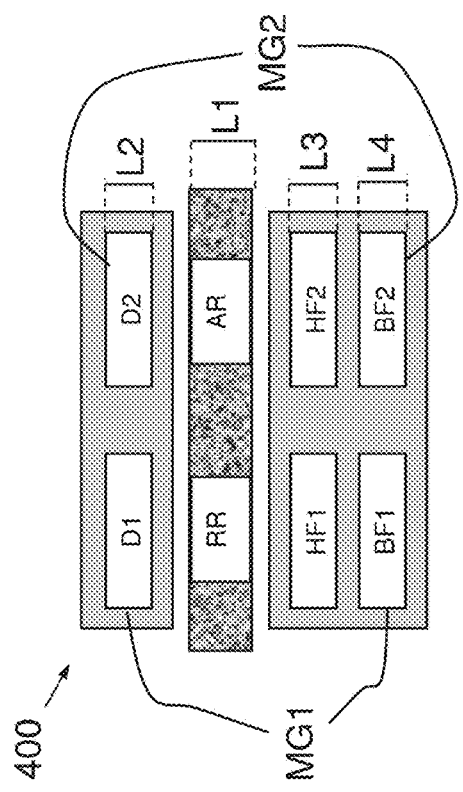
Figure 4H:
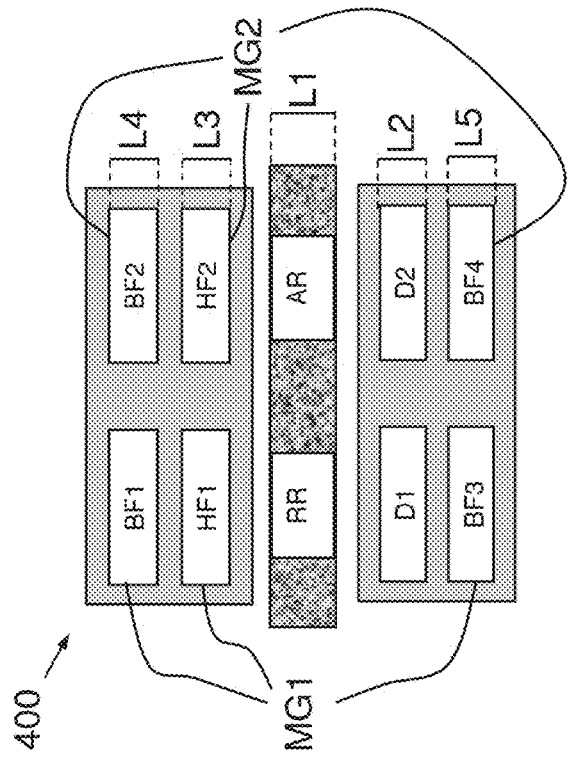
Figure 4E:
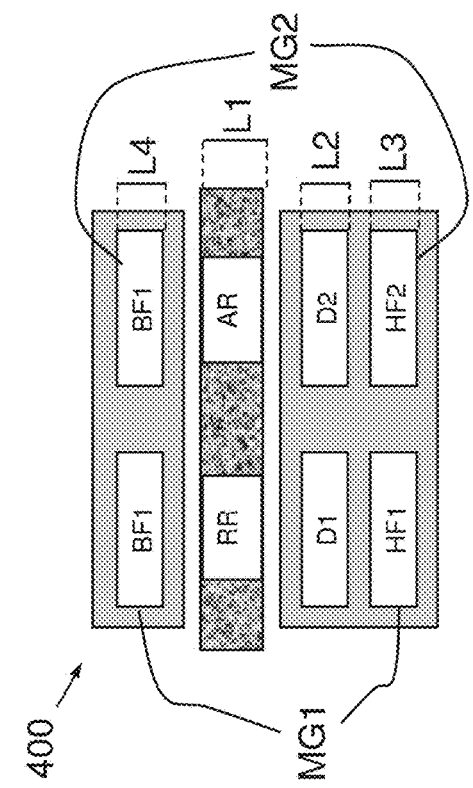

In the embodiment of FIG. 4(e), the upper layer is the layer L4 with the low frequency excitation coils BF1 and BF2, then comes the layer L1 with the two microfluidic reservoirs RR and AR, the layer L2 with the detection magnetic coils D1 and D2, and finally the layer L3 with the high frequency excitation coils HF1 and HF2.

In the embodiment of FIG. 4(f), the upper layer is the layer L2 with the detection magnetic coils D1 and D2, then comes the layer L1 with the two microfluidic reservoirs RR and AR, the layer L3 with the high frequency excitation coils HF1 and HF2, and finally the layer L4 with the low frequency excitation coils BF1 and BF2.

Figure 4G:
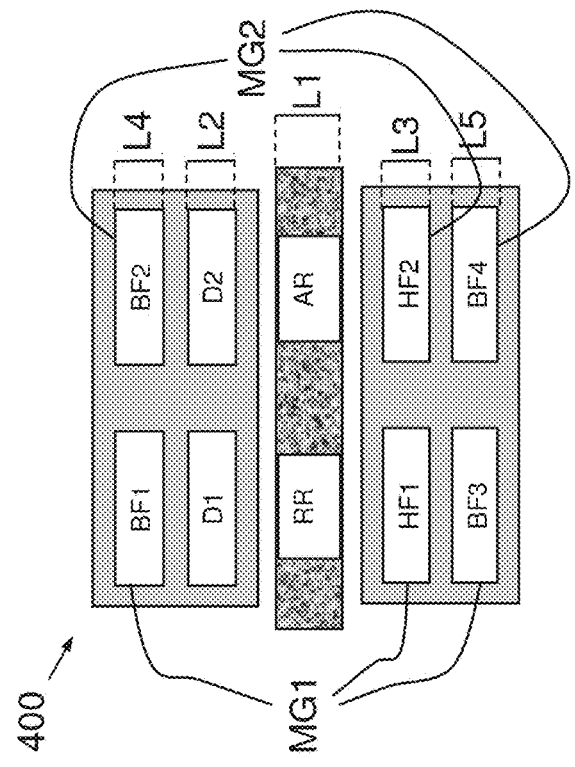

In the embodiment of FIG. 4(g), the electromagnetic sensing device 400 comprises an additional layer L5 that is a coil layer and comprises additional excitation coils, for example low frequency excitation coils BF3, BF4 or permanent magnet BF3, BF4. In the embodiment of FIG. 4(g), the upper layer is the layer L4 with the low frequency excitation coils BF1 and BF2, then comes the layer L2 with the detection magnetic coils D1 and D2, the layer L1 with the two microfluidic reservoirs RR and AR, the layer L3 with the high frequency excitation coils HF1 and HF2, and finally a layer L5 with the low frequency excitation coils BF3 and BF4.

In the embodiment of FIG. 4(h), the electromagnetic sensing device 400 comprises an additional layer L5 that is a coil layer and comprises also additional excitation coils, for example high frequency excitation coils HF3, HF4 (not represented), low frequency excitation coils BF3, BF4 or permanent magnet BF3, BF4. In the embodiment of FIG. 4(h), the upper layer is the layer L4 is with the low frequency excitation coils BF1 and BF2, then comes the layer L3 with the high frequency excitation coils HF1 and HF2, the layer L1 with the two microfluidic reservoirs RR and AR, the layer L2 with the detection magnetic coils D1 and D2 and finally a layer L5 with the low frequency excitation coils BF3 and BF4.

In one or more embodiments, two successive coil layers are formed on the upper face and lower face of a same PCB. For example, the two coil layers L2, L4 of FIG. 4(a) are formed on the upper face and lower face of a same PCB. Similarly, the two coil layers L2, L3 of FIG. 4(b) are formed on the upper face and lower face of a same PCB. Similarly, the two coil layers L3, L4 of FIG. 4(c) are formed on the upper face and lower face of a same PCB. Similarly, the two coil layers L2, L4 of FIG. 4(d) are formed on the upper face and lower face of a same PCB. Similarly, the two coil layers L2, L3 of FIG. 4(e) are formed on the upper face and lower face of a same PCB. Similarly, the two coil layers L3, L4 of FIG. 4(f) are formed on the upper face and lower face of a same PCB. Similarly, the two coil layers L2, L4 (and correspondingly the two coil layers L3, L5) of FIG. 4(g) are formed on the upper face and lower face of a same PCB. Similarly, the two coil layers L3, L4 (and correspondingly the two coil layers L2, L5) of FIG. 4(h) are formed on the upper face and lower face of a same PCB.

In one or more embodiments, the excitation magnetic coils and/or detection magnetic coils HF1, HF2, BF1, BF2, D1, D2 comprises miniaturized planar coils or microcoils. The set of miniaturized planar coils HF1, HF2, BF1, BF2, D1, D2 may be completely integrated in a so-called Lab-On-Chip (LOC) sensing device. In one or more embodiments, the excitation magnetic coils and/or detection magnetic coils HF1, HF2, BF1, BF2, D1, D2 are made of one or more planar spiral coils, for example miniaturized planar spiral coils. Miniaturized planar coils may be easily integrated in a PCB substrate. In addition, their integration enables minimal distance between detection coil and sample volume reservoir with MNP, thus enhancing the sensitivity to MNP.

In one or more embodiments, each of the excitation magnetic coils and/or detection magnetic coils is three-dimensional coil (3D coil) comprising stacked planar coils on several layers positioned on two sides of microfluidic reference and analyte reservoir plates. FIGS. 5(a)-5(b) shows pictures of an example embodiment of the electromagnetic sensing device 400 corresponding to the embodiment of FIG. 4(a), with stacked planar coils. FIG. 5(b) shows the side view of the electromagnetic sensing device 400 in which the four layers L1 to L4 are visible. In the coil layer L2, two 3D magnetic coils D1 and D2 are visible, wherein each 3D magnetic coil is made of four layers of spiral planar coils. Similarly, in the coil layer L3, two 3D magnetic coils HF1 and HF2 are visible, wherein each magnetic coil is made of four layers of spiral planar coils. Similarly, in the coil layer L4, two spiral magnetic coils BF1 and BF2 are visible, wherein each magnetic coil is made of four layers of spiral planar coils. As can be seen from FIG. 5(b), the two coil layers L2 and L4 are formed on the upper face and lower face of a same PCB substrate. The section of the reference microfluidic reservoir RR and analyte microfluidic reservoir AR are shown in the reservoir layer L1. FIG. 5(a) shows the upper view of the same electromagnetic sensing device 400 in which the two upper spiral magnetic coils BF1 and BF2 are visible.

In one or more embodiments, the electromagnetic sensing device 400 has a symmetrical structure: identical detection means and excitation means may be used for each of the two microfluidic reservoirs AR and RR. These detection or excitation means are positioned with respect to the corresponding microfluidic reservoirs in the same manner, i.e. at the same distance and in the same layers. The electromagnetic field produced by the MNP in the reference microfluidic reservoir RR and in the analyte microfluidic reservoir AR may thus be easily compared. Using a reference reservoir also improves the accuracy of the measurement of the electromagnetic field produced by the MNP in the analyte microfluidic reservoir AR insofar the effect of the analyte on the MNP may be clearly isolated and characterized independently of the other effects of the elements composing the electromagnetic sensing device 400.

In one or more embodiments, the electromagnetic sensing system 400 comprises two analyte microfluidic reservoirs (correspondingly, two reference microfluidic reservoirs) filled with different types of MNP, each analyte microfluidic reservoir (correspondingly, each reference microfluidic reservoir) being filled with a single type of MNP. This allows the multiple detections to occur with a same analyte.

In one or more embodiments, the electromagnetic sensing system 400 comprises a single analyte microfluidic reservoir (correspondingly a reference microfluidic reservoir) filled with different types of MNP. This allows the multiple detections to occur with a same analyte.

FIG. 6(e) represents schematically a multilayer PCB usable for manufacturing electromagnetic sensing device 400 according to an embodiment. In this embodiment, the PCB substrate comprises 8 layers and implements 4 spiral magnetic coils on the upper face and 4 spiral magnetic coils on the lower face. FIG. 6(d) is a picture of a PCB manufactured according to the schematic of FIG. 6(e). This PCB is separated into two coil layers, each coil layer comprising 2 spiral magnetic coils on each face. As shown in FIG. 6(c), two reservoir plates (corresponding to the plate represented in FIG. 6(a)) integrating both the reference microfluidic reservoir RR and the analyte microfluidic reservoir AR are placed between these two coil layers. The PCBs including the coil layers and reservoir plates are fixed to each other (for example with clips or screws) to ensure a proper alignment of the center of the spiral magnetic coils with the centers of the reference microfluidic reservoir RR and the analyte microfluidic reservoir AR during measurement.

In one or more embodiments, the magnetic frequency mixing method is applied to electromagnetic sensing device 400. The amplitude and/or phase of the response magnetic field of the MNP is detected and analyzed in the frequency domain to determine the amount of MNP. The amplitude of the mixing frequency terms, for instance $f_1+2f_2$, may be used for detecting and quantifying the amount of MNP. The phase can yield additional information on the hydrodynamic size and the binding state of the MNP.

Figure 7:
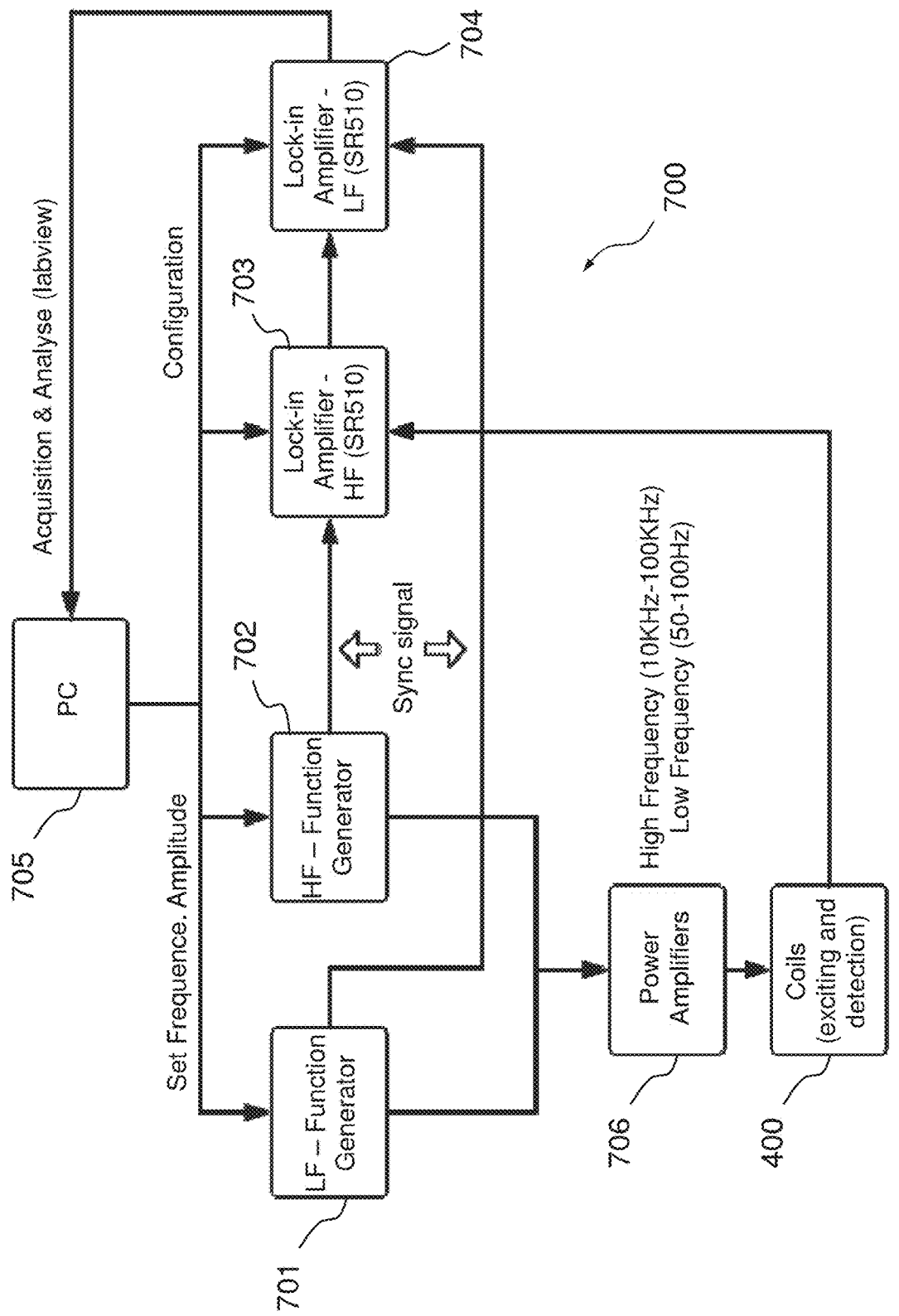
FIG. 7 represents schematically the bloc diagram of an instrumentation for the electromagnetic sensing system.

An example embodiment of an electromagnetic sensing system 700 is schematically represented by FIG. 7. The electromagnetic sensing system 700 may be used for implementing the magnetic frequency mixing method.

In one or more embodiments, the electromagnetic sensing system 700 comprises an electromagnetic sensing device 400 as disclosed therein, for example one of the electromagnetic sensing devices described by reference to FIG. 4.

In one or more embodiments, the electromagnetic sensing system 700 comprises a first oscillator 701 that generates an electrical signal at the frequency of the modulating magnetic field and feeds the excitation magnetic coils BF1, BF2 of the electromagnetic sensing device 400. This electrical signal is converted, by means of the magnetic coils of the magnetic field generator MG, into a low frequency excitation magnetic field applied both to the analyte in the analyte microfluidic reservoir AR and to the reference substance in the reference microfluidic reservoir RR.

In one or more embodiments, the electromagnetic sensing system 700 comprises a second oscillator 702 that generates an electrical signal at the frequency of the scanning magnetic field and feeds the excitation magnetic coils HF1, HF2 of the electromagnetic sensing device 400. This electrical signal is converted, by means of the magnetic coils of the magnetic field generator MG, into a high frequency excitation magnetic field applied both to the analyte in the analyte microfluidic reservoir AR and to the reference substance in the reference microfluidic reservoir RR.

In one or more embodiments, the electromagnetic sensing system 700 comprises a first lock-in amplifier 703, configured to receive the electrical signal at the frequency of the scanning magnetic field, detecting and amplifying the electrical response signals at the frequency of the scanning magnetic field generated by the detection magnetic coils D1, D2 when detecting the response magnetic field generated by the MNP both in the analyte microfluidic reservoir AR and in the reference microfluidic reservoir RR.

In one or more embodiments, the electromagnetic sensing system 700 comprises a second lock-in amplifier 704, configured to receive the electrical signal at the frequency of the modulating magnetic field, receiving the electrical signal generated by the first lock-in amplifier 703, detecting and amplifying the electrical response signals at the frequency of the modulating magnetic field generated by the detection magnetic coils D1, D2 when detecting the response magnetic field generated by the MNP both in the analyte microfluidic reservoir AR and in the reference microfluidic reservoir RR.

In one or more embodiments, the electromagnetic sensing system 700 comprises a data processing device 707 for generating a frequency spectrum of the signal produced by the second lock-in amplifier 704 and analyzing this frequency spectrum.

In one or more embodiments, the electromagnetic sensing system 700 comprises a power amplifier for amplifying the electrical signals generated by each of the two oscillators 701 and 702 before feeding the electromagnetic sensing device 400.

Analytical calculations and simulation results for the excitation and detection magnetic coils are presented to demonstrate how planar spiral coils may be used for a simple and cost effective sensing system.

Several parameters and properties of the electromagnetic sensing device 400 may be adjusted to improve the performances of the electromagnetic sensing device: the dimensions and shape of the excitation and detection magnetic coils, the fabrication method, the distance from the detection magnetic coils to the microfluidic reservoirs, the area of detection for the microfluidic reservoirs, etc.

For sensitive magnetic field detection, the design and manufacture of detection and excitation coils of the electromagnetic sensing device 400 may be optimized to get a more sensitive detection and an efficient magnetization. In addition, it is desirable to reduce the heating effects as they may cause substantial damage to the biological samples and endanger the detection. Heating can also cause both a decrease and fluctuation in the detected magnetic field since the magnetization of the MNP is inversely proportional to the temperature. Consequently, compromises between the different factors may be made in order to improve the sensitivity of the electromagnetic sensing device 400. For example, a compromise may be made to get a small enough total value of coil resistance (for noise and electrical adaptation purposes) and a big enough number of turns for sufficient magnetic field amplitude for the excitation coils and higher sensitivity for the detection coil.

The main factors that give an upper and lower dimension limit of the magnetic coils will be presented.

In one or more embodiments, spiral miniaturized coils are used for precise detection of MNP in a miniaturized system. Due to their symmetry, analytical calculations may be easily performed for finding the optimal dimensions of the miniaturized coils. These analytical calculations have been validated with a PCB/microfluidic prototype as disclosed for example by reference to FIGS. 5 and 6.

It has been demonstrated, that using the magnetic frequency mixing technique, a limit of detection of 15 g/mL of 20 nm core sized MNP may be achieved without any shielding. Further, the electromagnetic sensing device 400 has a linear response which makes it easy to use and calibrate.

The two main aspects of a detection magnetic coil are: sensitivity and noise. From the two values of sensitivity and noise, the physical limits of the detection magnetic coil may be computed in terms of minimum detectable magnetic moment and magnetic moment sensitivity. Below the computation is presented in case the MNP are superparamagnetic nanoparticles (SPN) and planar spiral coils are used.

The magnetic moment sensitivity $S_{sensor}$ of a magnetic coil with respect to the detection of SPN is defined here as the ratio of the induced voltage $U_{ind}(Z)$ to the magnetic moment that causes it:

$$S_{sensor} = \frac{U_{ind}(Z)}{m_z}$$

where $m_z = m_{00} \times \sin(2\pi f t)$ is the total magnetic moment of all SPN and Z is the distance to the coil center. This approximation holds when all the nanoparticles exhibit the same magnetization response both in amplitude and direction when subjected to the same magnetic excitation field.

The induced voltage caused by $m_z$, at a distance Z produced in a single turn of the coil having a radius R, can be expressed as:

$$U_{(z,t)} = -\frac{d\Phi}{dt} = \frac{1}{2R}\frac{\mu_0}{(r^2+z^2)^{\frac{3}{2}}} \times \frac{dm_z}{dt} \quad (1)$$

where $$r = \frac{R}{R_1}, z = \frac{Z}{R_1}$$

are the dimensionless parameters relative to the internal radius $R_1$ of the spiral coil.

Integration over the width $w = W/R_1$ of the spiral coil gives the result in the form of:

$$U_0 = \frac{N}{w}\int_1^{1+w} U(z,t) dw = m_z \mu_0 2\pi f \frac{N}{2R_1} \times G(z,w) \quad (2)$$

where $U_0$ is expressed in Volt (V) and $$G(z,w) = \quad (3)$$
$$\frac{1}{w}\left[\frac{1}{\sqrt{1+z^2}} - \frac{1+w}{\sqrt{(1+w)^2+z^2}} + \ln\left(\frac{1+w+\sqrt{(1+w)^2+z^2}}{1+\sqrt{1+z^2}}\right)\right]$$

is the geometrical function representing the effect of the detection magnetic coil dimensions, $\mu_0$ is the magnetic permeability of free space and N is the number of windings of the coil. From this, the total sensitivity for $N_l$ layers may be computed as:

$$S_{sensor} = \mu_0 2\pi f \frac{N}{2R_1} \times \sum_{i=1}^{N_l} G(z_i, w) \quad (4)$$

where $S_{sensor}$ is expressed in V/Am² and $z_i$ denotes the distance of each spiral layer to the magnetic moment (sample location)

With regard to noise, the aim is to approach the minimum detectable magnetic moment that is defined by the moment that can be detected when noise and signal become equal (SNR=1). Since it takes into account the first preamplifier stage, this measurable value is used to compare the efficiency of various sensors with respect of detecting magnetic beads.

Generally, a detection system includes a pre-amplification stage, a damping resistance ($R_p$) and a parallel capacitance ($C_p$). A magnetic coil can be represented electrically by its lumped parameters: Inductance $L_S$, an AC resistance $R_{AC}$ and a parallel capacitance $C_S$. As stated in document by Krause, et al., Journal of Magnetism and Magnetic Materials, n° 311, pages 436-444, 2007, the total noise voltage can be estimated:

$$U_N = \sqrt{\frac{U_a^2}{|TF(f)|^2} + \left(\frac{4k_BT}{R_P} + I_a^2\right) \times |R_S + i2\pi f L_S|^2 + 4k_B T R_s} \quad (5)$$

where $U_a$ and $I_a$ are the voltage and current noise of the preamplifier, $TF(f)$ is the transfer function of the detection circuit, $k_B$ is the Boltzmann constant, $R_S$ is the Ohmic resistance of the coil, $i=\sqrt{-1}$ is the imaginary unit and T is the absolute temperature. All the electrical parameters may be optimized so that the Johnson noise is dominant, so that only the sensor noise is left. Consequently, the detection magnetic coil may be optimized to have maximum sensitivity with minimum resistance and inductance values. A high inductance value will result in a high current noise contribution.

The corresponding magnetic flux noise density $B_N$ can be computed by multiplying the total noise voltage by the overall coil sensitivity:

$$B_N \cong \frac{2}{\pi^2 N_l N \times (2R_1 + H)^2 f} U_N \quad (6)$$

Two values of interest can be deduced from this; the signal to noise ratio (SNR) and the minimum detectable magnetic moment.

In the case where the choice of readout electronics is correctly done, we can assume that the SNR is the ratio of the detected signal versus the thermal noise: $U_N = \sqrt{4k_B T \Delta f R_S}$, with $R_S = R_{skin} + R_{DC} + R_{proximity} \cong R_{DC}$. Since the skin depth, that is the standard penetration depth $z = 1/\sqrt{\pi\mu\sigma f}$ of an alternating electromagnetic field of frequency f into a conducting medium with conductivity σ and permeability μ, for our maximum frequency is around 200 μm, the skin and proximity effects are negligible. After measurement on magnetic coils integrated into a PCB substrate, it was found that they account for less than 20% of the resistance for frequencies below 100 kHz. Thus $$U_N = 4\sqrt{\frac{\rho\pi k_B T}{H_{wire}}} \times \frac{\sqrt{1+\frac{w}{2}}}{\sqrt{w}} \quad (7)$$

with ρ, $k_B$, T, $H_{wire}$ denoting the resistivity, the Boltzmann constant, the absolute temperature and the height of wire section, respectively.

The SNR is then:

$$\frac{U_{ind}}{\sqrt{2}\,U_N} = m_z \frac{\mu_0 \sqrt{\pi}}{4\sqrt{\rho k_B T}} f \times \left[ \frac{\sqrt{H_{wire}}}{R_1} \times \frac{\sum_{i=1}^{N_l} G(z_i, w)}{N_l \sqrt{w} \sqrt{1 + \frac{w}{2}}} \right] \quad (8)$$

Whereas SNR is directly observed and is related to the geometry of the coil, to the frequency and the physical parameters, the minimum detectable moment gives a physical limit that can be linked to a given amount and concentration of SPN. A chosen absolute limit of this value is when the SNR is equal to 1 (or 0 dB).

$$\frac{m_z}{\sqrt{\Delta f}} = \frac{4\sqrt{\rho k_B T_o}}{\mu_0 \sqrt{\pi}} \frac{1}{f} \left[ \frac{R_1}{\sqrt{H_{wire}}} \times \frac{N_l \sqrt{w} \sqrt{1 + \frac{w}{2}}}{\sum_{i=1}^{N_l} G(z_i, w)} \right] \quad (9)$$

Consequently, it is possible to detect smaller magnetic moments by using higher frequencies and a smaller internal radius.

In one or more embodiments, the dimension of the detection magnetic coil may be optimized by finding a compromise between sensitivity and minimum detectable moment.

Figure 8:
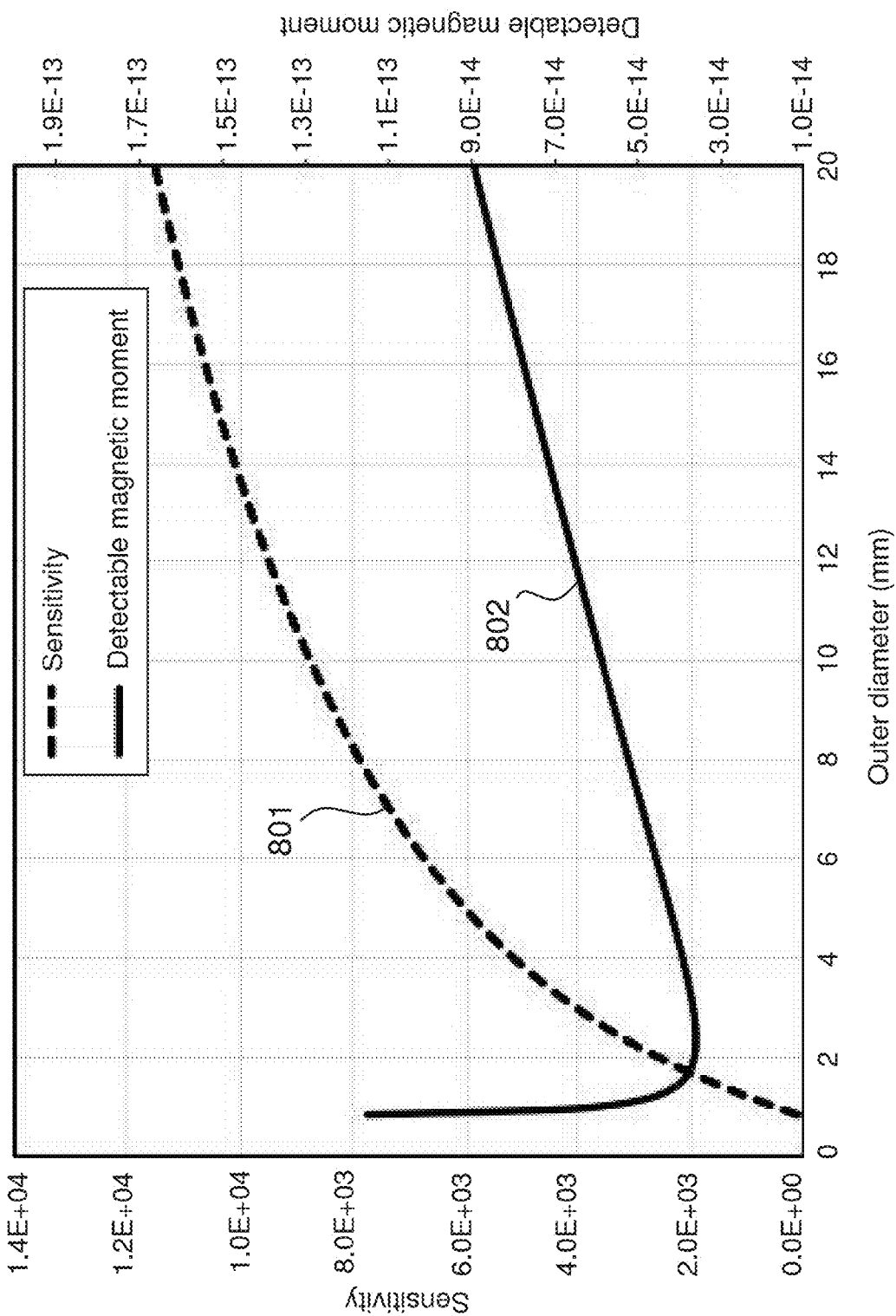
FIG. 8 represents curves showing the sensitivity and the minimum detectable magnetic moment versus outer diameter of a planar detection coil.

FIG. 8 represents curves showing the sensitivity and the minimum detectable magnetic moment versus outer diameter of a planar detection magnetic coil having an internal radius fixed to 0.8 mm. Curve 801 shows the sensitivity as a function of the outer diameter of the spiral coils as defined previously by equation (4). Curve 802 shows the minimum detectable magnetic moment as a function of the outer diameter of the spiral coils as defined previously by equation (9).

As can be seen from curves 801 and 802, for an outer radius over a threshold ($R_{out} > 4$ mm) there is an area where the added noise due to increasing number of turns becomes predominant with regard to the improvement on sensitivity. These two curves 801, 802 may be used for selecting an outer diameter so that the ratio between the sensitivity and detectable magnetic moment becomes high. The dimension of the detection coil may so be optimized by finding a compromise between sensitivity and minimum detectable moment. In this embodiment, it has been shown that an outer diameter between 5 mm and 12 mm may be used to achieve a good performance.

The detection magnetic coil optimization may be performed in conjunction with excitation coil optimization. Magnetic excitation of SPN is of high interest. In fact, the actual limit of detection in terms of number of SPN can be smaller than expected if the SNP are not properly magnetized.

Since the magnetic frequency mixing technique relies on the detection of the nonlinear response of superparamagnetic nanoparticles (SPN), the magnetic field amplitude may be adapted in consequence. As explained in patent application US 2007/0155024, the low frequency field ($f_2$) magnetic field is used as a drive field and the high frequency field ($f_1$) magnetic field is used as an excitation amplitude. For the case of relatively small magnetic fields, the amplitude of the mixed frequency term is proportional to the high frequency amplitude and to the square of the low frequency amplitude. Because of this, emphasis on minimum required amplitude is directed to low frequency, whereas for high frequency, the frequency of use contributes more to the optimization of the system. For example, for 20 nm nanoparticles, a total magnetic field having 2 mT as drive amplitude and around half of it as excitation amplitude may be used.

Using the generated magnetic field from single turn circular coils, the effects of the different radii are summed to get the magnetic field density generated on the symmetry axis of the spiral coil:

$$B_z(z_i) = \frac{\mu_0 * N * I_{exc}}{2 * R_1} \times \sum_{i=1}^{i=N_l} G(z_i, h) \quad (10)$$

where $I_{exc}$ is the excitation current. The formula is then used to find the minimum excitation current. The distribution of magnetic field is assumed to be rather homogeneous along the radial dimension of the detection/analyte reservoir in order to achieve a homogeneous sensitivity distribution. This assumption has been confirmed by electrical simulations of the magnetic field generated by a spiral coil. The homogeneity of the distribution of the magnetic field depends on the inside and outside radius and on the distance of the reservoir from the center of the spiral coil. In order to get a proper magnetization of SPN, for a fixed distance Z we obtain the best appropriate distance that a reservoir may be at and we deduce the maximum area that it can occupy.

Because the structure is intended for immunoassays with biological samples, the electrical simulation is coupled with a heat transfer simulation. This allow to take into account both electromagnetic and heat aspects. The maximum measurement time can thus be determined based on the maximum allowed temperature in the reservoir (37° C.). As mentioned in introduction, the minimum measurement time is also dependent on the choice of the frequency of modulation magnetic field.

Increasing the number of turns of an excitation magnetic coil helps to reduce the minimum used current and thus the power consumption. However, the added value of the external turns becomes negative after a certain threshold, where the number of turns increase the resistance and inductance in a linear and quadratic manner, respectively. This leads to a decrease in the minimum current because of their low contribution to the generated magnetic field. The optimum number of windings may however be calculated for a given geometry in order not to impair the sensitivity of the electromagnetic sensing device 400.

Furthermore, the sensitivity of the device increases when the frequency of the scanning magnetic field is bigger. However, the maximum frequency that can be used is limited by two factors: the relaxation time of the SPN and the complexity of generating relatively high currents for the resulting high frequency impedance.

Figure 5:
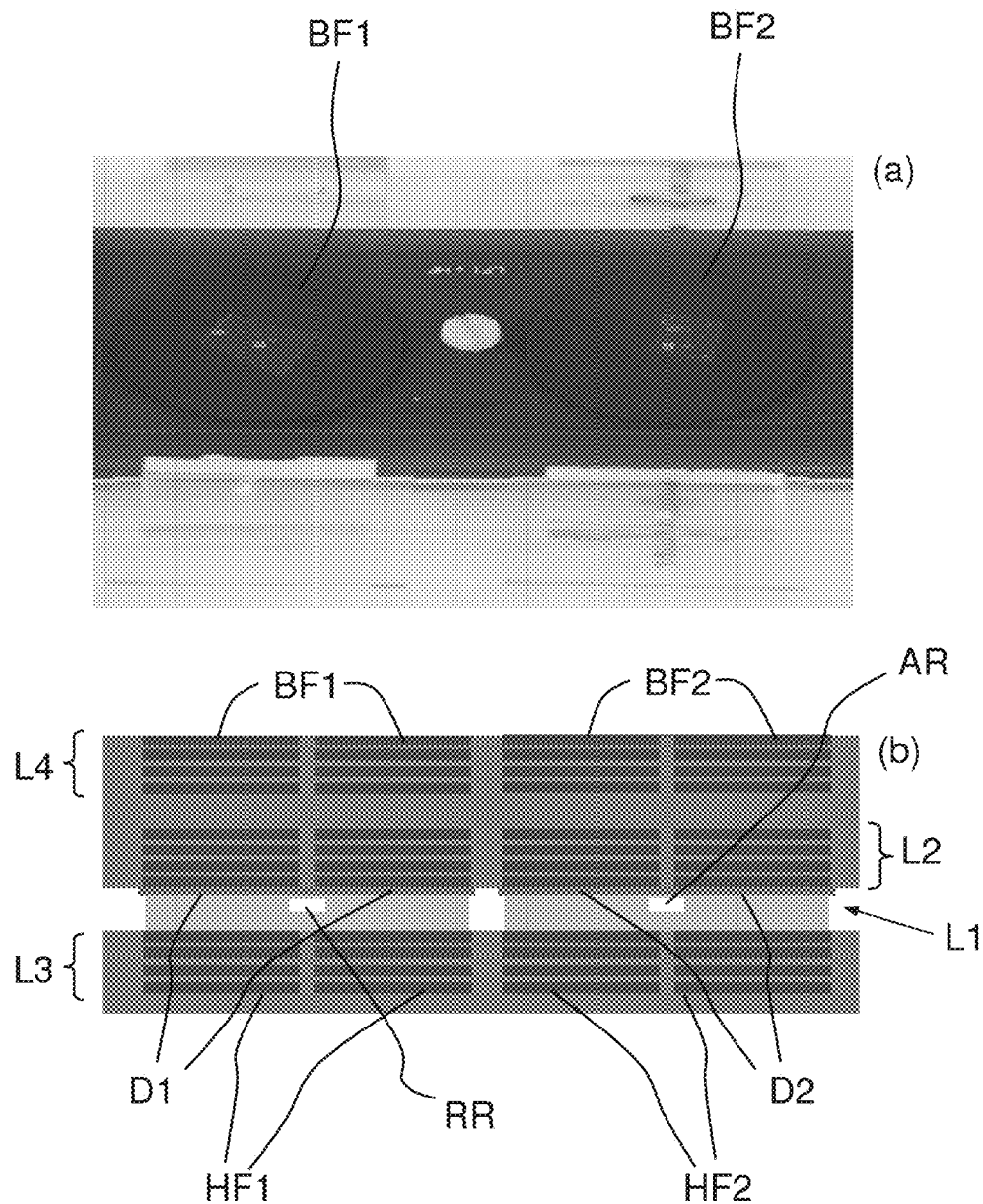
FIGS. 5(a)-5(b) represent an example embodiment of an electromagnetic sensing device.
Figure 6A:
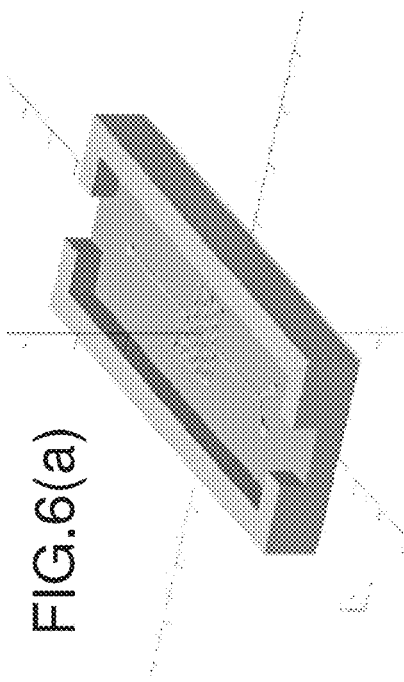

In one or more embodiments, the electromagnetic sensing device 400 is implemented as a PCB/microfluidic sensing device as represented by FIG. 5. The electromagnetic sensing device 400 is composed of 3 copper magnetic coils for each microfluidic reservoir: two magnetic coils emit the excitation electromagnetic field, one for low frequency magnetic field and the other for high frequency magnetic field, the third one is the detection magnetic coil. These magnetic coils are integrated in two PCB structures surrounding the microfluidic reservoir which can contain 14 µL of MNP solution. Each of the magnetic coils are composed of four layers of spiral planar coils. The tracks of the spiral planar coils are 100 µm wide with an inter-distance of 100 µm. Each layer has a thickness of 35 µm. The emitting coils have a radius of 13 mm (60 turns/layer) and the detection magnetic coil has a radius of 10 mm (46 turns/layer). Because both the excitation and detection magnetic coils are integrated in the same PCB, a balance between the above mentioned criteria may be found to improve both magnetization and detection. In one or more embodiments, the distance between the PCBs is 4 mm and the distance between the detection magnetic coil (lower PCB) and the microfluidic reservoir is 1 mm. The microfluidic reservoir is a serpentine channel of 12λ12 mm2 surface with a section of 0.5 mm width and 0.2 mm height (see FIG. 6(b)). This kind of sensing device using a PCB structure is relatively big and can be commercially purchased so it is easier and faster to use for preliminary results.

In one or more embodiments, the low frequency is chosen $f_2$=80 Hz with a coil voltage of 14 V and a high frequency of $f_1$=40 kHz with a voltage of 30 V. The response electronic signal which comes out of the detection magnetic coil is amplified by a factor of 500 using a standard lock-in amplifier. We used iron oxide nanoparticles ($Fe_2O_3$) with different concentrations to validate the detection technique and define the limit of detection (LOD) of the structure. The core of the nanoparticles is approximately 20 nm in mean diameter. Their flower-like structure offers stability at such large diameters, thus a higher magnetic moment response. These SPN are introduced into the microfluidic reservoir composed of PDMS/glass structure, we then stopped the flow before doing the measurements. A miniaturized fully integrated sensing device may also be manufactured in a cleanroom: the miniaturized sensing device could be much smaller so it will increase its transportability by decreasing the size, the weight and the power consumption of the sensing device. Furthermore this will decrease the testing sample and reagent volumes. Further, the cleanroom technology allow a more accurate positioning of detection magnetic coils with respect to the analyte microfluidic reservoir, i.e. closer and with much more precision, thus allowing better expected limit of detection for smaller sample volumes.

Further properties and advantages of the electromagnetic sensing device 400 according to the present description will be illustrated below by reference to FIGS. 9-11.

Figure 9:
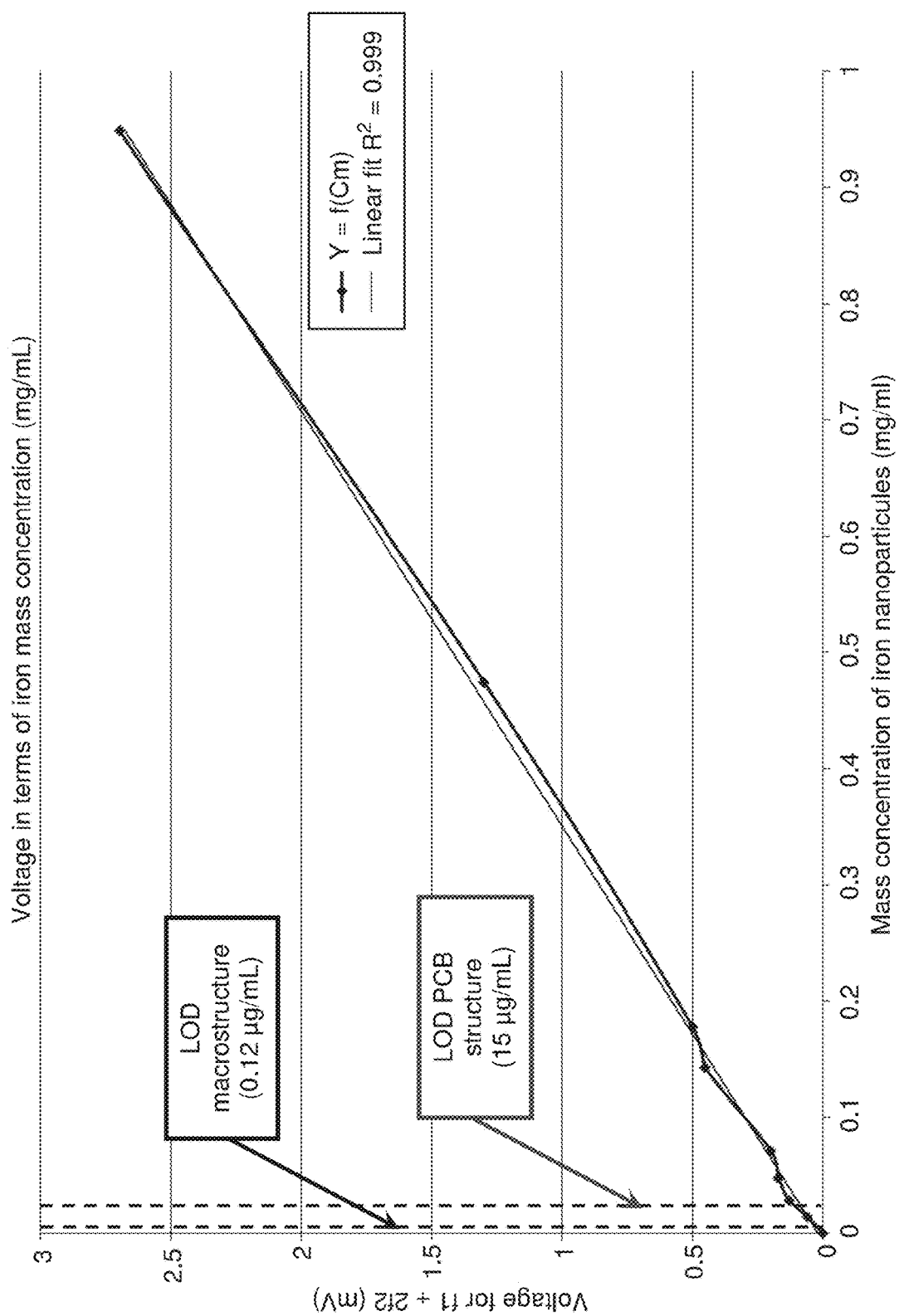
FIG. 9 represents curves showing magnetic response as a function of the mass concentration of iron nanoparticles.

FIG. 9 represents a curve 901 showing properties of an electromagnetic sensing device according to the present description. The curve 901 is the magnetic response (i.e. the voltage in mV of the detected electrical response signal produced by the detection magnetic coils) as a function of the mass concentration (mg/ml) of iron nanoparticles. The dotted lines indicate the limits of detection (LOD) under which no accurate detection can be achieved anymore. LODs for unbound MNP detection are given for the optimized macrostructure described in patent document US2007/0155024A1 and the PCB stucture described in the present description.

As can be seen from curve 901, a very good linearity with a coefficient of determination of $R^2$=0.999 for a linear range of 3 orders of magnitude is obtained. Furthermore, the test were repeated in day's interval and proved to be very reproducible. With an accepted error of less than 15%, our limit of detection is 15 µg/mL. A linear relationship is achieved at least in the range [0.02 mg/mL-0.9 mg/mL]. The limit of detection (LOD) is almost two orders of magnitude higher that the LOD of 0.12 µg/mL obtained for the optimized macrostructure described in patent document US2007/0155024A1.

Additional noise sources (both internal and external) increase the difference between theoretical and experimental LOD. The internal noise sources include: electrical noise from the excitation circuit that results in crosstalk, white magnetic field noise, and a small but non-negligible temperature gradient that slightly changes the magnetization. Diffusion heterogeneity of ferrofluids is also a contributing factor for the error bars displayed in the above-mentioned performance curve (FIG. 11). External interfering signals can be in the form of magnetic field disturbances from adjacent power sources and electronic instruments.

Figure 10:
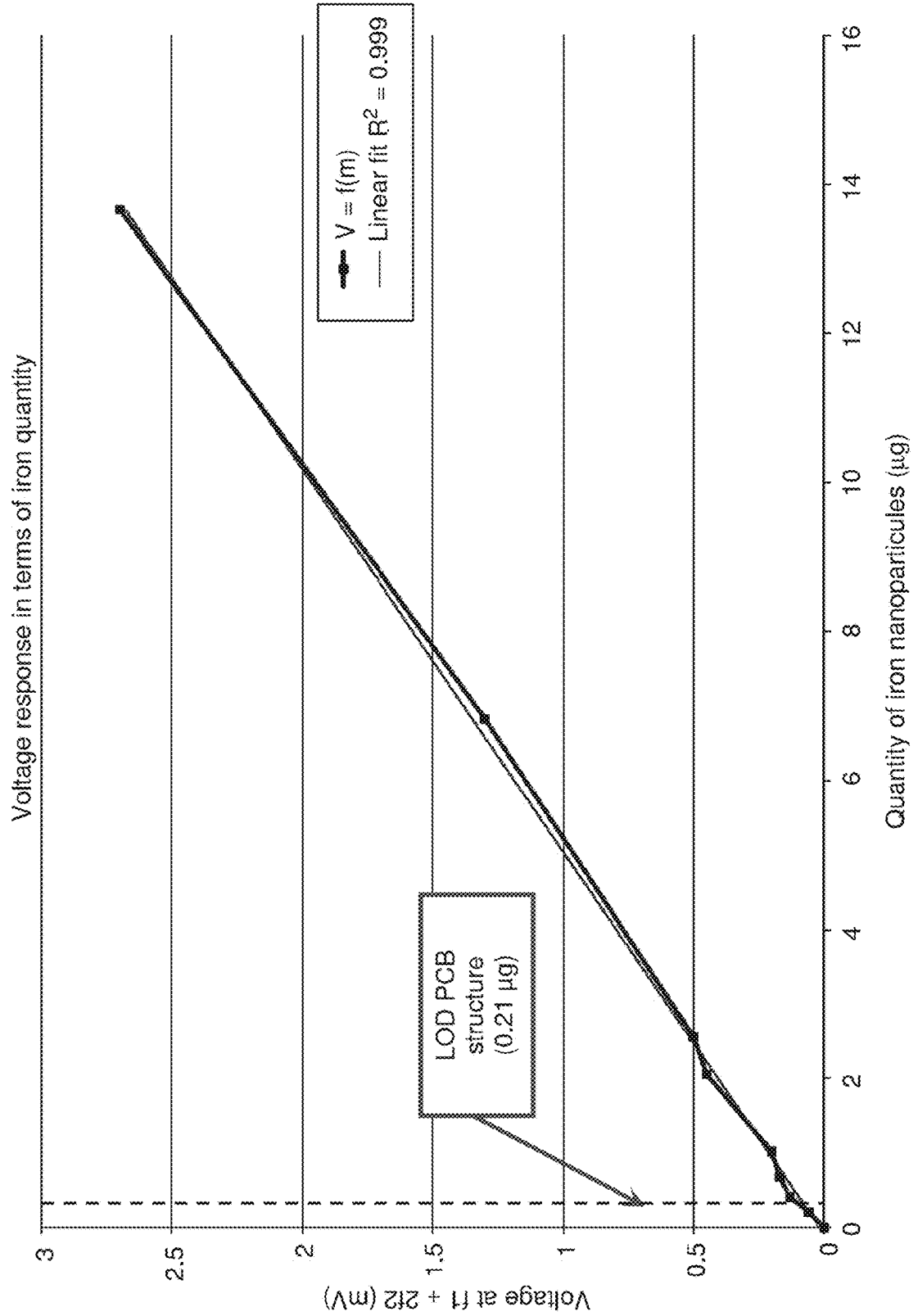
FIG. 10 represents curves showing magnetic response as a function of iron nanoparticles quantity.

FIG. 10 represents curves showing properties of an electromagnetic sensing device according to the present description. Curve 1001 represents the voltage (expressed in mV) of the detected electrical response signal produced by the detection magnetic coil at the frequency ($f_1$+2$f_2$) as a function of iron quantity (expressed in µg) in the MNP. A linear relationship is achieved at least in the range [0.2 µg-14 µg]. The dotted line indicates the limit of detection.

Figure 11:
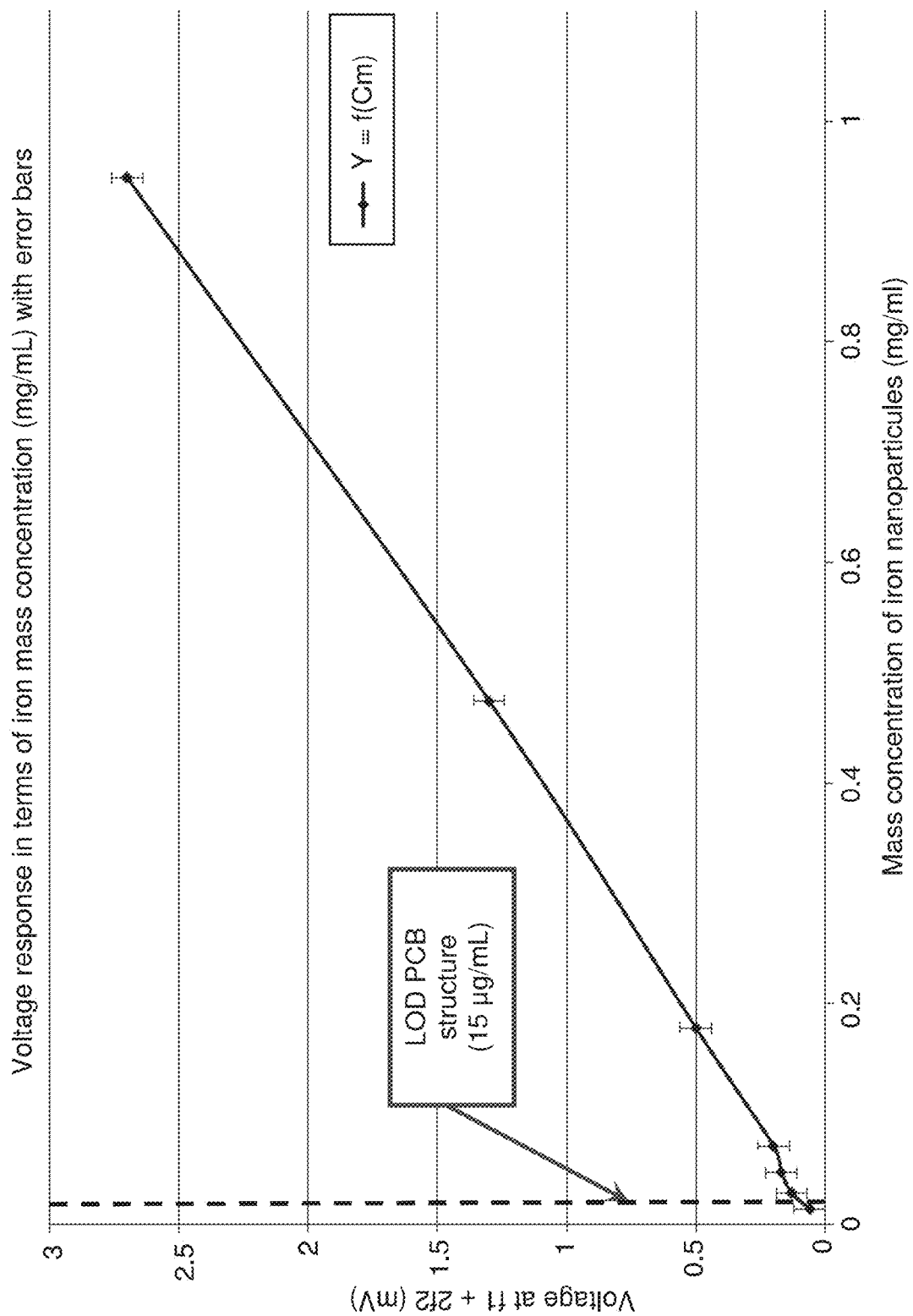
FIG. 11 represents curve showing magnetic response as a function of the mass concentration of iron nanoparticles with error bars.

FIG. 11 represents curves showing properties of an electromagnetic sensing device according to the present description. The curve 1101 represents the voltage (expressed in mV) of the detected electrical response signal produced by the detection magnetic coil at the frequency ($f_1$+2$f_2$) as a function of iron mass concentration (expressed in µg/mL) of the analyzed substance with error bars representing the average measurement error for a few tests. The error rate is more than 50% only below the limit of 0.01 mg/mL.

The proposed method of detection can be coupled with magnetic actuation techniques, provided no ferromagnetic material is used in the vicinity of the detection and actuation area.

Also, the offered simplicity of printed circuit board (PCB) coils allows very fast integration of both coils and electronic accompanying circuitry, reaching the goal of low cost embedded magnetic detection system without any complex fabrication procedures and of the shelves technologies.

In the area of public health and with the increasing number of travels by flight in the world, one possible application is the epidemiological control at the airports. The electromagnetic sensing device disclosed herein may found other applications for field biological analysis by practitioners in disaster areas especially in underdeveloped countries, autonomous biological analysis (autonomous elderly people, sailors, hikers and frequent travelers, . . . ); biological analyzes for the protection of the environment, etc.

Although described by way of a number of detailed example embodiments, the electromagnetic sensing device, system and method according to the present description comprise various variants, modifications and improvements that will be obvious to those skilled in the art, it being understood that these various variants, modifications and improvements fall within the scope of the disclosed devices or methods such as defined by the following claims.

The invention claimed is:

1. A electromagnetic sensing device for detecting magnetic nanoparticles, MNP, the electromagnetic sensing device comprising:
   a reference microfluidic reservoir configured to receive a reference substance with MNP;
   an analyte microfluidic reservoir configured to receive an analyte and MNP;

an input channel for introducing the analyte into the analyte microfluidic reservoir;

at least one first excitation magnetic coil configured to subject the reference microfluidic reservoir to an alternating magnetic field at a first frequency at least one second excitation magnetic coil configured to subject the analyte microfluidic reservoir to an alternating magnetic field at the first frequency;

at least one third excitation magnetic coil configured to subject the reference microfluidic reservoir to an alternating magnetic field at a second frequency distinct from the first frequency;

at least one fourth excitation magnetic coil configured to subject the analyte microfluidic reservoir to an alternating magnetic field at the second frequency;

at least one first detection magnetic coil configured to detect a response magnetic field of the MNP in the reference microfluidic reservoir;

at least one second detection magnetic coil configured to detect a response magnetic field of the MNP in the analyte microfluidic reservoir;

wherein the electromagnetic sensing device is structured according to a plurality of superimposed layers, comprising at least three coil layers and a reservoir layer;

wherein the reference microfluidic reservoir is integrated into a first plate in the reservoir layer and the analyte microfluidic reservoir is integrated into a second plate in the reservoir layer;

wherein the first and second detection magnetic coils are integrated into a first printed-circuit-board (PCB) substrate in a first coil layer;

wherein the first and second excitation magnetic coils are integrated into the PCB substrate in a second coil layer;

wherein the third and fourth excitation magnetic coils are integrated into the PCB substrate in a third coil layer;

wherein the reservoir layer is immediately between the first coil layer and one of the second and third coil layers.

2. A electromagnetic sensing device according to claim 1, wherein the first, and correspondingly the second plate, is an electrically insulating plate, made of polydimethylsiloxane on glass in which the reference microfluidic reservoir, and correspondingly the analyte microfluidic reservoir, is formed.

3. A electromagnetic sensing device according to claim 1, wherein first and second plates are two physically distinct plates.

4. A electromagnetic sensing device according to claim 1, wherein the first and second plates are one and the same plate.

5. A electromagnetic sensing device according to claim 1, wherein the analyte microfluidic reservoir has the shape of a serpentine channel.

6. A electromagnetic sensing device according to claim 1, wherein the third coil layer is the uppermost or lowest layer among the plurality of superimposed layers.

7. A electromagnetic sensing device according to claim 1, comprising a fourth coil layer with additional excitation coils for subjecting both the reference microfluidic reservoir and the analyte microfluidic reservoir to an alternating magnetic field at the first or second frequency.

8. A electromagnetic sensing device according to claim 1, wherein two successive coil layers are formed on the upper face and lower face of a same PCB.

9. A electromagnetic sensing device according to claim 1, wherein the excitation magnetic coils or detection magnetic coils comprises miniaturized planar coils.

10. A electromagnetic sensing device according to claim 1, wherein the excitation magnetic coils or detection magnetic coils comprises spiral coils.

11. A electromagnetic sensing device according to claim 1, wherein each of the excitation magnetic coils or detection magnetic coils is a three-dimensional coil made of stacked spiral planar coils.

12. A electromagnetic sensing device according to claim 1, comprising two analyte microfluidic reservoirs, and correspondingly two reference microfluidic reservoirs, wherein each analyte microfluidic reservoir, and correspondingly each reference microfluidic reservoir, is filled with a single type of MNP, distinct from the type of MNP filled in the other reference microfluidic reservoir, and correspondingly the other analyte microfluidic reservoir.

13. A electromagnetic sensing system comprising,
an electromagnetic sensing device according to claim 1,
a first oscillator configured to generate an electrical signal at the first frequency and to feed the first and second excitation magnetic coils;
a second oscillator configured to generate an electrical signal at the second frequency and to feed the third and fourth excitation magnetic coils;
a first lock-in amplifier configured to receive the electrical signals generated by the detection magnetic coils and the electrical signal at the first frequency;
a second lock-in amplifier configured to receive a signal generated by the first lock-in amplifier and the electrical signal at the second frequency;
a data processing device configured to generate a frequency spectrum of a signal produced by the second lock-in amplifier and to analyze the frequency spectrum.

14. A method for detecting magnetic nanoparticles, MNP, using an electromagnetic sensing device according to claim 1, the method comprising:
subjecting the reference microfluidic reservoir and the analyte microfluidic reservoir to two alternating magnetic fields having distinct frequencies;
detecting simultaneously a first response magnetic field of the MNP in the reference microfluidic reservoir and;
a second response magnetic field of the MNP in the analyte microfluidic reservoir.

15. A method according to claim 14, further comprising comparing the first response magnetic field and the second response magnetic field to detect or quantify biological entities in the analyte microfluidic reservoir.

* * * * *